United States Patent
Hama et al.

(10) Patent No.: US 7,603,962 B2
(45) Date of Patent: *Oct. 20, 2009

(54) ROTARY TYPE CVD FILM FORMING APPARATUS FOR MASS PRODUCTION

(75) Inventors: Kenichi Hama, Kanagawa (JP); Tsuyoshi Kage, Chiba (JP); Takumi Kobayashi, Singapore (SG); Takeharu Kawabe, Chiba (JP)

(73) Assignees: Mitsubishi Shoji Plastics Corporation, Tokyo (JP); Youtec Co., Ltd., Nagareyama-shi (JP)

( * ) Notice: Subject to any disclaimer, the term of this patent is extended or adjusted under 35 U.S.C. 154(b) by 831 days.

This patent is subject to a terminal disclaimer.

(21) Appl. No.: 10/516,732

(22) PCT Filed: Jun. 19, 2003

(86) PCT No.: PCT/JP03/07797

§ 371 (c)(1),
(2), (4) Date: Dec. 3, 2004

(87) PCT Pub. No.: WO04/001095

PCT Pub. Date: Dec. 31, 2003

(65) Prior Publication Data

US 2005/0155553 A1 Jul. 21, 2005

(30) Foreign Application Priority Data

Jun. 24, 2002 (JP) ............................. 2002-183309

(51) Int. Cl.
C23C 16/00 (2006.01)

(52) U.S. Cl. .............................. 118/723 E; 118/723 R; 118/728; 427/577; 427/238

(58) Field of Classification Search ................. 427/237, 427/577, 238, 569, 429.7; 118/723 E, 723 R, 118/728

See application file for complete search history.

(56) References Cited

U.S. PATENT DOCUMENTS 3,616,458 A * 10/1971 Moriya ................... 422/186.05
4,746,538 A * 5/1988 Mackowski ................. 427/577

(Continued)

FOREIGN PATENT DOCUMENTS

EP 1 010 733 6/2000

(Continued)

Primary Examiner—Michael Kornakov
Assistant Examiner—Xiao Zhao
(74) Attorney, Agent, or Firm—Oblon, Spivak, McClelland, Maier & Neustadt, L.L.P.

(57) ABSTRACT

A rotary type CVD film forming apparatus for mass production, wherein a film forming chamber is formed by providing one columnar body having a plurality of housing spaces for housing one plastic container each in one said housing space, a plurality of said film forming chambers is arranged on a rotation support body at equal intervals in a circular state, source gas introduction means serving as an external electrode which introduce a source gas that is converted to plasma inside the plastic containers housed in each of said film forming chambers is provided, and high frequency supply means which supply a high frequency to the external electrode of each of said film forming chambers is provided to form a CVD (chemical vapor growing) film on the internal surfaces of said plastic containers.

8 Claims, 12 Drawing Sheets

U.S. PATENT DOCUMENTS

| | | | |
|---|---|---|---|
| 5,565,248 A * | 10/1996 | Plester et al. | 427/571 |
| 5,798,139 A * | 8/1998 | Nagashima et al. | 427/237 |
| 6,294,226 B1 * | 9/2001 | Shimamura | 427/577 |
| 6,924,001 B2 * | 8/2005 | Hama et al. | 427/237 |

FOREIGN PATENT DOCUMENTS

| | | |
|---|---|---|
| JP | 08-053117 | 2/1996 |
| JP | 10-258825 | 9/1998 |
| JP | 2001-335945 | 12/2001 |
| JP | 2002-121667 | 4/2002 |
| JP | 2003-171771 | 6/2003 |

* cited by examiner

Arrangement of Film Forming Chambers on Rotation Support Body

Parallel Type

Cascade Type

Slanting line portion: Actual Discharge Area

ROTARY TYPE CVD FILM FORMING APPARATUS FOR MASS PRODUCTION

TECHNICAL FIELD

The present invention is related to a film forming apparatus which carries out continuous manufacturing by a rotary system, and in particular to a CVD film forming apparatus for mass production in a CVD film forming apparatus which coats the internal surface of a plastic container with a CVD film by a CVD (Chemical Vapor Deposition, chemical vapor growing) method, and a film forming method thereof.

PRIOR ART TECHNOLOGY

A vapor deposition apparatus which uses a CVD method, in particular, a plasma CVD method to vapor deposit a DLC (Diamond Like Carbon) film on the internal surface of a plastic container in order to improve the gas barrier properties and the like of containers such as containers for carbonated beverages and high fruit juice beverages and the like is disclosed in Japanese Laid-Open Patent Publication No. HEI 8-53117, for example. Further, Japanese Laid-Open Patent Publication No. HEI 10-258825 discloses a manufacturing apparatus for mass producing DLC film coated plastic containers and a manufacturing method thereof.

Japanese Laid-Open Patent Publication No. HEI 10-258825 discloses an apparatus in which a plurality of chambers is arranged at equal intervals on the same circle, the external electrodes of adjacent chambers are connected by lead wires, and each external electrode is connected to a high frequency power source by a lead wire in a straight line extending from the center of the circle. This apparatus carries out film formation simultaneously in a plurality of containers.

However, in the apparatus described above which proposes one embodiment of a manufacturing apparatus for mass producing DLC film coated plastic containers, problems regarding the following points remain. Namely, because simultaneous film formation is carried out completely for a plurality of containers, ① a high frequency power source having a high output is needed; ② a very large exhaust rate is required; ③ because there is a large time loss due to the need to load and unload the containers all at once, the amount of time that can be spent as film formation time in the time required for one cycle is short; ④ in the case where a manufacturing cycle is repeated to carry out mass production, there is no proposal as to how the loading and unloading of the containers is to be carried out. For example, in the case where the circle is rotated at the container loading time and unloading time and the circle is stopped at the film formation time, because there is a need to carry out control to oppose the inertia of the circle, the power load is large. On the other hand, in the case where the circle is stationary, because a conveyor or the like is needed to supply containers and take out coated containers, the size of the apparatus becomes large.

SUMMARY OF THE INVENTION

In developing a mass production apparatus for forming a CVD film on the internal surfaces of containers, the present inventors reached the conclusion that in order to miniaturize the apparatus and raise the mass production efficiency, instead of forming a film simultaneously in all film forming chambers, preferably a plurality of film forming chambers is arranged in the shape of a circle on a rotation support body, the rotation support body is rotated at a fixed speed, and the manufacturing cycle of each film forming chamber is controlled during the time the rotation support body (turntable) undergoes one rotation.

The manufacturing cycle is a cycle which includes (1) a container loading process for plastic containers, (2) a pre-film-formation gas adjustment process for the inside of the containers, (3) a CVD film forming process which converts the source gas to plasma, (4) a post-film-formation gas adjustment process for the inside of the containers, and (5) a coated container removal process.

In the present invention, the CVD film forming apparatus carries out one manufacturing cycle for the film forming chambers arranged on a circle during the time the rotation support body undergoes one rotation is classified as a rotary type, and this is different from a single application apparatus and the batch system apparatus disclosed in Japanese Laid-Open Patent Publication No. HEI 10-258825.

In the case where the rotary type CVD film forming apparatus for mass production described above is used, it was thought that a matching box and a power source would be provided for each film forming chamber, but because this uses a large number of components, it is not possible to sufficiently miniaturize the apparatus. For example, because the smallest size matching box is about 200 mm×200 mm×150 mm, the film forming unit becomes very large, and this becomes an obstacle to making the apparatus compact. In addition to this, because a matching box is a very expensive item, the cost of the apparatus increases. The same problems as those of the matching box also apply to high frequency power source.

When the provision of the rotary type CVD film forming apparatus for mass production in a plant which manufactures plastic containers is considered, the newly added apparatus must be sufficiently miniaturized and have superior cost performance.

Because the apparatus needs to be miniaturized and inexpensive, it is thought that this problem can be solved by making the number of high frequency power sources and matching boxes smaller than the number of film forming chambers.

It was thought that the number of arranged high frequency power sources and matching boxes could be made smaller than the number of film forming chambers by using the technology disclosed in Japanese Laid-Open Patent Publication No. HEI 10-258825. However, in such publication, fellow external electrodes arranged at equal intervals are only connected by lead wires, and the distribution of high frequency is shifted slightly by the slack of the lead wires and the connection positions of the lead wires. In particular, because the high frequency is transmitted to the surface of a conductor, the shift of the high frequency distribution becomes remarkable due to the complex surface shape created by the fellow external electrodes connected by the lead wires. Consequently, the technology of this same publication having the principle of simultaneous film formation can not be applied to a rotary type apparatus of the type which carries out film formation successively in accordance with the rotation angle of a rotation support body rotated at a fixed speed, and it is difficult to apply a uniform DLC film over all the plurality of plastic containers.

Further, when a matching box is provided for each of the external electrodes housing the plastic containers in order to reduce only the high frequency power sources, because there will be minute differences between the matching times created by the matching boxes, it is not possible to precisely match the matching times with each other. Namely, a mutual shift of about 0.1~1 second is created in the impedance matching in each matching box. Further, because the film thickness of the DLC film formed on the internal surfaces of the plastic containers is thin at about 30 nm, about 3 seconds is sufficient for the film formation time, and for this reason the forming of films needs to be controlled with relatively good precision. Consequently, the matching time shift of about 0.1~1 second has a large effect on the dispersion of film thicknesses of the DLC films, namely, the film thickness dispersion between the plastic containers. Accordingly, this creates dispersion in the quality of the DLC films. When one matching box is connected to one high frequency power source and a plurality of external electrodes is connected to one matching box, the dispersion is even larger than the case of the embodiment described above.

Consequently, it is extremely difficult to make the number of arranged high frequency power sources and matching boxes smaller than the number of film forming chambers in a rotary type CVD film forming apparatus for mass production.

In view of the problems described above, it is an object of the present invention to provide a rotary type CVD film forming apparatus for mass production which can be miniaturized by making the number of high frequency power sources and matching boxes smaller than the number of film forming chambers by proposing a novel external electrode structure which makes it possible to generate a uniform self bias voltage on the wall surfaces of a prescribed number of plastic containers housed in one external electrode when a high frequency is supplied. The present inventors call this novel external electrode structure a "multiple-integrated external electrode". The multiple-integrated external electrode makes it possible to reduce the film thickness dispersion, achieve compactness by reducing the number of structural components and simplifying the structure, achieve easy maintenance, and reduce the cost of the apparatus.

Further, by forming the apparatus as a rotary type, it is an object to (1) achieve a small size, (2) make it unnecessary to form an exhaust rate large enough to create a vacuum simultaneously in all the film forming chambers, (3) not apply wasted power by not carrying out control to oppose the rotation inertia of the rotation support body, (4) form a long CVD film formation time for one manufacturing cycle interval, (5) improve the mass production efficiency by shortening the time outside the film forming process, and (6) reduce the required output of the high frequency power source compared to the film forming apparatus that carries out film formation simultaneously for all the film forming chambers.

At this time, it is an object of the present invention to generate uniform plasma in every container when film formation is carried out simultaneously in a plurality of plastic containers housed in a multiple-integrated external electrode by arranging the housing spaces side by side at equal intervals on the same circle which uses the central axis of the external electrode as a center point.

Further, it is an object of the present invention to propose several specific embodiments of a multiple-integrated external electrode which have particularly good compatibility with a rotary type CVD film forming apparatus. In a rotary type CVD film forming apparatus, a plurality of film forming chambers is arranged on a rotation support body to form a rotary type, but the containers do not always need to be arranged in one row in the circumferential direction of the same circle which uses the rotation axis of the rotation support body as a center point as in a beverage filling apparatus, for example. Because the arrangement of the housing spaces of the external electrode has a fixed restriction which can be changed appropriately, in addition to the object of reducing the number of high frequency power sources and the number of matching boxes, the multiple-integrated external electrode makes it possible to increase the number of rows of housing spaces in the circumferential direction described above. For example, when changing from one row to two rows, it is an object to double the productivity per unit time by ensuring that two film forming chambers undergo film formation at exactly the same timing in accordance with the rotation of the rotation support body with the size of the apparatus becoming only slightly larger. Further, it is an object to triple the productivity in the same way by forming three rows. However, as the number of rows is increased to increase the productivity, the mechanism which loads plastic containers inside the film forming chambers arranged on the rotation support body becomes extremely complex, and the mechanism which removes coated plastic containers becomes complex in the same way. In the present invention, a particularly preferred arrangement of container housing spaces is proposed in the rotary type apparatus to increase the productivity while preventing the container loading mechanism and the container removing mechanism from becoming complex.

It is an object of the present invention to propose specific housing space arrangements in particular for the case where two housing spaces are provided in one external electrode, the case where three housing spaces are provided in one external electrode, and the case where four housing spaces are provided in one external electrode.

Further, it is an object of the present invention to carry out cooperation smoothly between a container supply line, the present apparatus and a coated container conveying line by completing the entire film forming process during the time the rotation support body undergoes one rotation in the rotary type apparatus of the present invention. Further, it is an object to conserve power by fixing the rotation speed of the rotation support body.

Further, it is an object of the present invention to provide a rotary type CVD film forming apparatus for mass production and a CVD film forming method which form a CVD film, in particular, a DLC film using a hydrocarbon gas or a Si-containing hydrocarbon gas as a source gas.

The rotary type CVD film forming apparatus for mass production according to the present invention of the present inventors which should solve the problems described above includes a film forming chamber formed by providing one columnar body serving as an external electrode having a plurality of housing spaces for housing one plastic container each in one said housing space so that the central axis of each of said housing spaces is parallel with the central axis of said external electrode and said housing spaces are arranged side by side on the same circle which uses the central axis of the external electrode as a center point, providing internal electrodes which can be arranged to be freely inserted from the mouth portion into the inside of the plastic containers loaded in each of said housing spaces, providing an insulating member to form an insulating state between the internal electrodes and the external electrode when said internal electrodes are inserted inside said plastic containers, and providing a cover which is closed for reducing the pressure inside said housing spaces, wherein a plurality of said film forming chambers is arranged on a rotation support body at equal intervals in a circular state, source gas introduction means which introduce a source gas that is converted to plasma inside the plastic containers housed in each of said film forming chambers is provided, and high frequency supply means which supply a high frequency to the external electrode of each of said film forming chambers is provided to form a CVD film on the internal surfaces of said plastic containers.

In the rotary type CVD film forming apparatus for mass production, preferably said housing spaces are arranged side by side at equal intervals on the same circle which uses the central axis of said external electrode as a center point.

In the rotary type CVD film forming apparatus for mass production, preferably two housing spaces are provided in one external electrode, and said film forming chambers are arranged at equal intervals on said rotation support body so that said housing spaces are arranged on the same circle which uses the rotation axis of said rotation support body as a center point.

In the rotary type CVD film forming apparatus for mass production, preferably two housing spaces are provided in one external electrode, and when said film forming chambers are arranged on said rotation support body, one housing space is arranged outside a circle formed by each of said film forming chambers and the other housing space is arranged inside said circle, whereby the housing spaces of said external electrodes are arranged in two rows in the circumferential direction of said circle.

In the rotary type CVD film forming apparatus for mass production, preferably three housing spaces are provided in one external electrode, and when said film forming chambers are arranged on said rotation support body, a relationship is formed so that two housing spaces of every other film forming chamber are arranged outside the circle formed by the film forming chambers with the remaining one housing space arranged inside said circle, and two housing spaces of the adjacent film forming chambers are arranged inside said circle with the remaining one housing space arranged outside said circle, whereby the housing spaces of said external electrodes are arranged in two rows in the circumferential direction of said circle.

In the rotary type CVD film forming apparatus for mass production, preferably four housing spaces are provided in one external electrode, and when said film forming chambers are arranged on said rotation support body, two housing spaces are arranged outside a circle formed by the film forming chambers, and the other two housing spaces are arranged inside said circle, whereby the housing spaces of said external electrodes are arranged in two rows in the circumferential direction of said circle.

In the rotary type CVD film forming apparatus for mass production, preferably when said film forming chambers are arranged on said rotation support body, said housing spaces are arranged in two rows in the circumferential direction of said circle with said circle interposed between mutually adjacent housing spaces, or said housing spaces are arranged in two rows in said circumferential direction with said circle interposed between mutually shifted housing spaces.

Further, the method of forming a CVD film on the internal surfaces of plastic containers according to the present invention carries out a container loading process which loads said plastic containers in said film forming chambers by housing said plastic containers in said housing spaces, a pre-film-formation gas adjustment process which replaces the inside of said plastic containers with a source gas adjusted to a prescribed film forming pressure, a CVD film forming process which converts said source gas to plasma and forms a CVD film on the internal surfaces of said plastic containers, a post-film-formation gas adjustment process which opens the inside of coated plastic containers to the atmosphere, and a container removal process which removes said coated containers from said film forming chambers during the time the rotation support body undergoes one rotation at a fixed speed.

In the rotary type CVD film forming apparatus for mass production and in the method of forming a CVD on the internal surfaces of plastic containers, preferably a hydrocarbon gas or a Si-containing hydrocarbon gas is used as said source gas, and a DLC film is formed as said CVD film.

The present invention makes it possible to provide a small-sized, inexpensive CVD film forming apparatus having a high mass production efficiency which is an apparatus of the type which carries out one manufacturing cycle on the film forming chambers during the time the rotation support body undergoes one rotation, in particular, a rotary type apparatus for mass production which forms a CVD film on the internal surfaces of plastic containers. In the present invention, the productivity is increased while preventing the container loading mechanism and the container removing mechanism from becoming complex in the rotary type apparatus. The present invention makes it possible to simultaneously make it unnecessary to form an exhaust rate large enough to create a vacuum simultaneously in all the film forming chambers, makes it unnecessary to apply wasted power because control to oppose the rotation inertia of the rotation support body is not carried out, form a long CVD film formation time for one manufacturing cycle interval, raise the mass production efficiency by shortening the time outside the film forming process, make the number of high frequency power sources and matching boxes smaller than the number of film forming chambers, and reduce the required output of the high frequency power source compared to the film forming apparatus that carries out film formation simultaneously for all the film forming chambers.

Further, the present invention makes it possible to carry out cooperation smoothly between a container supply line, the present apparatus and a coated container conveying line by completing the entire film forming process during the time the rotation support body undergoes one rotation in the rotary type apparatus of the present invention.

Further, the present invention makes it possible to provide a rotary type CVD film forming apparatus for mass production and a CVD film forming method which form a CVD film, in particular, a DLC film using a hydrocarbon gas or a Si-containing hydrocarbon gas as a source gas.

BRIEF DESCRIPTION OF THE DRAWINGS

FIG. 3 shows schematic drawings of one embodiment of a multiple-integrated external electrode formed from one columnar body which can simultaneously coat four plastic containers with a DLC film in the present invention, wherein FIG. 3(a) shows the state where the lower portion external electrode and the upper portion external electrode are sealed, and FIG. 3(b) shows the state where the lower portion external electrode and the upper portion external electrode are open.

FIG. 6 shows conceptual drawings of the arrangement of housing spaces in the case where two housing spaces are provided in one external electrode, wherein FIG. 6(a) is the case where the housing spaces are arranged on a circle, FIG. 6(b) is the case where the circle is interposed between adjacent housing spaces, FIGS. 6(c) and 6(d) are cases where the circle is interposed between mutually shifted housing spaces.

FIG. 8 shows conceptual drawings of the arrangement of housing spaces in the case where four housing spaces are provided in one external electrode, wherein FIG. 8(a) is the case where the housing spaces 40 of the external electrode 3 are arranged in two rows in the circumferential direction of the circle s formed by the film forming chambers, wherein the two housing spaces 40x, 40y are arranged outside the circle s, and the remaining two housing spaces 40a, 40b are arranged inside the circle s, FIG. 8(b) is the case where there are two rows in the circumferential direction and the circle s is interposed between mutually shifted housing spaces, and FIG. 8(c) is the case where there is more shifting than that of FIG. 8(b).

Figure 1:
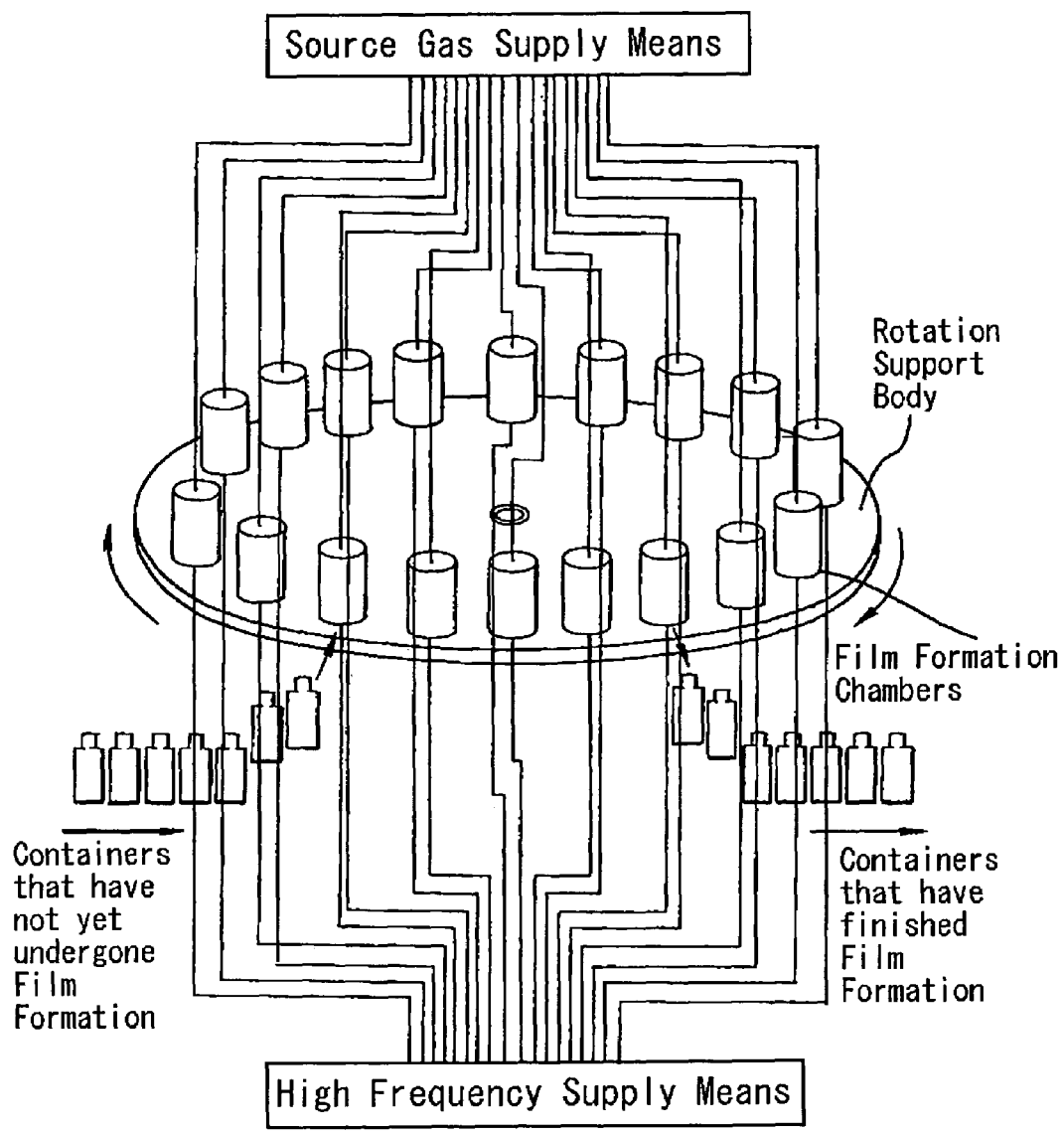
FIG. 1 is a schematic drawing which shows one embodiment of the rotary type CVD film forming apparatus for mass production of the present invention.

The meaning of the symbols is as follows. 1 is a lower portion external electrode, 2 is an upper portion external electrode, 3 is an external electrode, 4a is an insulating member, 4b is a cover, 6 is a film forming chamber, 7, 7a, 7b, 7c, 7d are plastic containers, 8 is an O-ring, 9, 9a, 9b, 9c, 9d are internal electrodes, 10, 11, 22 are pipelines, 14 is an automatic matching device, 15 is a high frequency power source (RF power source), 16, 17, 18 are vacuum valves, 19 is a mass flow controller, 20 is a source gas generating source, 21 is a vacuum pump, 27 is a leak gas (air) supply source, 28 is a vacuum gage, 29 is an exhaust duct, 30 is a high frequency output supply rod, 32 is a high frequency output supply rod connection contact, 40 is a housing space, 41 is source gas introduction means, 49, 49a, 49b are gas blowout holes, x1 is the center of the multiple-integrated external electrode, x2 is a high frequency output supply point, X is the central axis of the multiple-integrated external electrode, 7ax, 7bx, 7cx, 7dx are center points of the housing spaces of the plastic containers 7a, 7b, 7c, 7d.

PREFERRED EMBODIMENTS OF THE INVENTION

A plurality of embodiments is given below to describe the present invention in detail, but it should not be interpreted that the present invention is limited to these embodiments. Further, the same symbols are used for the same members in the drawings.

The embodiments of the present invention will be described with reference to FIGS. 1~14. FIG. 1 is a conceptual drawing which shows the relationship of the basic structure of a rotary type CVD film forming apparatus for mass production according to the present invention. The rotary type CVD film forming apparatus for mass production according to the present invention is provided with film forming chambers, a rotation support body on which the plurality of film forming chambers is arranged at equal intervals on a circle, source gas introduction means which introduce a source gas that is converted to plasma to the inside of plastic containers housed in each film forming chamber, and high frequency supply means which supply a high frequency to the external electrode of each film forming chamber, and forms a CVD film on the internal surface of the plastic containers.

Figure 2:
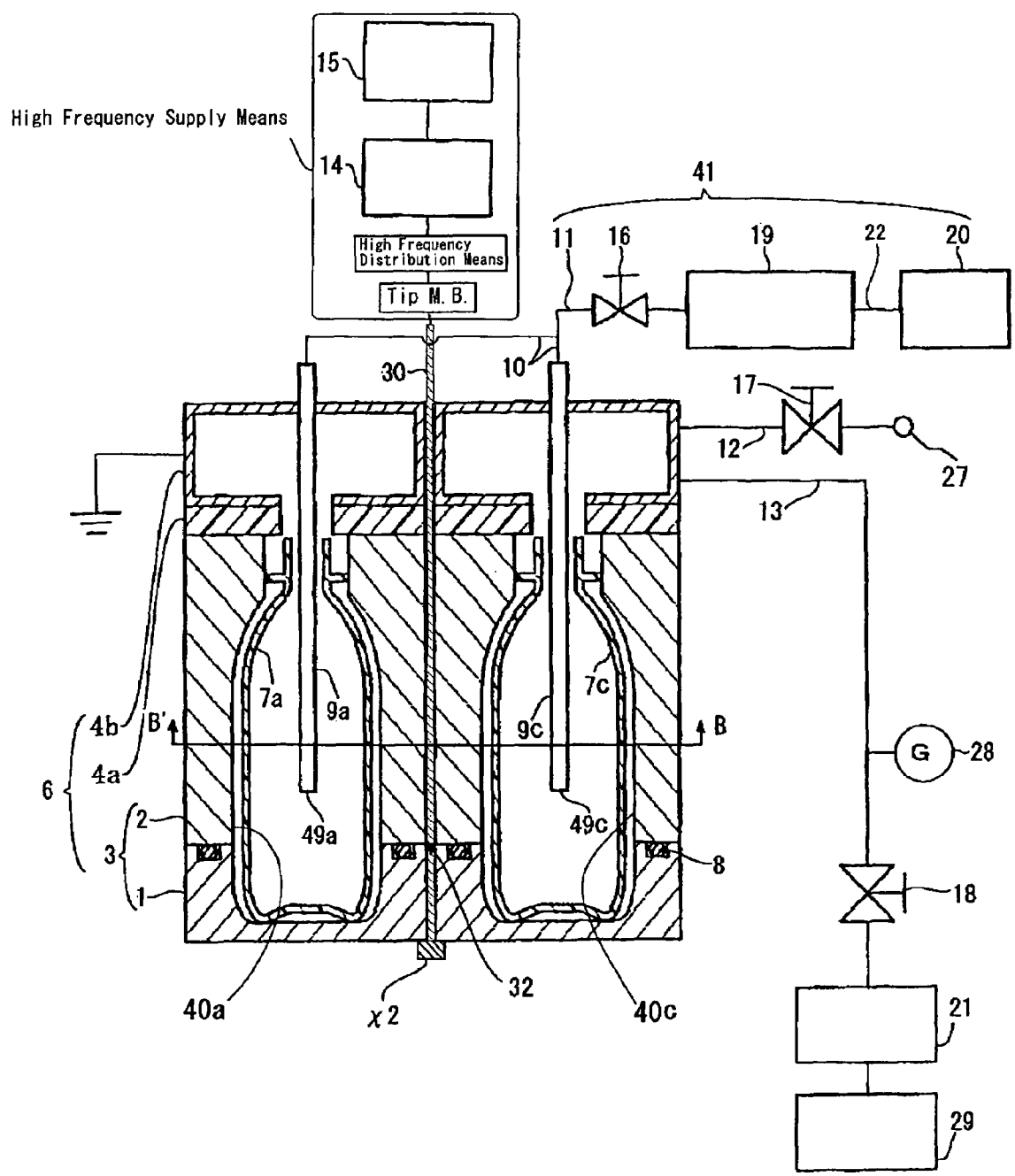
FIG. 2 is a schematic drawing which shows one embodiment of the basic structure of film forming chambers in the rotary type CVD film forming apparatus for mass production of the present invention.

FIG. 2 is a conceptual drawing showing the structure of one film forming chamber from those of FIG. 1, and the portion of the film forming chamber 6 of FIG. 2 is a cross-sectional conceptual drawing taken along the axial direction of the container. The film forming chamber 6 is formed from an external electrode 3 formed to have the shape of one cylindrical body provided with a plurality of housing spaces 40a, 40c which each house one of plastic containers 7a, 7c, internal electrodes 9a, 9c which can be arranged to be freely inserted from the mouth portion to the inside of the plastic containers 7a, 7c loaded respectively in the housing spaces 40a, 40c, an insulating member 4a which forms an insulating state between the internal electrodes 9a, 9c and the external electrode 3 when the internal electrodes 9a, 9c are inserted inside the plastic containers 7a, 7c, and a cover 4b which closes the film forming chamber 6 so that pressure can be reduced inside the housing spaces 40a, 40c.

The cover 4b is formed from a conducting material, and supports the internal electrodes 9a, 9c. A space which communicates with the housing spaces 40a, 40c is provided inside the cover 4b, and this space together with the housing spaces 40a, 40c form a pressure-reducing space. In the apparatus of FIG. 2, exhaust means constructed from a vacuum pump 21 and the like are connected to the cover 4b, and this forms a structure in which it is possible to reduce the pressure in the housing spaces 40a, 40c by reducing the pressure in the space of the cover 4b.

In FIG. 2, the insulating member 4a is arranged below the cover 4b, and the external electrode 3 is arranged below the insulating member 4a. By forming this kind of positional relationship, an insulating state is formed between the cover 4b, the conducting internal electrodes 9a, 9c and the external electrode 3 by the insulating member 4a.

The external electrode 3 is formed from an upper portion external electrode 2 and a lower portion external electrode 1, and is constructed so that the upper portion of the lower portion external electrode 1 is removably mounted to the lower portion of the upper portion external electrode 2 via an O-ring 8. The plastic containers 7a, 7c can be loaded by removing and mounting the upper portion external electrode 2 and the lower portion external electrode 1.

Further, in the embodiment of FIG. 2, the external electrode 3 is divided into the two electrodes of the lower portion external electrode 1 and the upper portion external electrode 2, but in order to make the CVD film have a uniform thickness or the like, the external electrode may be divided into three electrodes such as a bottom portion electrode, a trunk portion electrode and a shoulder portion electrode, for example, or into more than three electrodes, wherein each electrode may be sealed by the interposing of an O-ring, for example, and electrically insulated by a fluororesin sheet or a polyimide film or a polyether ether ketone (PEEK) film.

The spaces 40a, 40c are formed inside the external electrode 3, and these spaces are housing spaces for housing the coating object plastic containers 7a, 7c, for example, PET bottles which are containers made from polyethylene terephthalate resin. The housing spaces 40a, 40c inside the external electrode 3 are formed so as to be possible to house a plastic container 7 housed therein. In this regard, the housing spaces 40a, 40c are preferably formed to be slightly larger than external shape of the plastic container. Namely, the inner wall surfaces of the container housing spaces 40a, 40c are preferably formed to have a shape (similar shape) that surrounds the vicinity of the outside of the plastic containers 7a, 7c. This is done in order to create a uniform self bias voltage on the wall surfaces of the plastic containers. However, so long as a self bias voltage is applied uniformly to the internal surface of a plastic container, the inner wall surfaces of the housing spaces of the external electrode do not need to be formed with a similar shape. An opening which communicates with the housing spaces 40a, 40c inside the external electrode 3 is formed in the cover 4b. Further, a space is provided in the inside of the cover 4b, and this space communicates with the housing spaces 40a, 40c inside the external electrode 3 via the opening described above. The housing spaces 40a, 40c are sealed from the outside by the O-ring 8 arranged between the upper portion external electrode 2 and the lower portion external electrode 1, and this makes it possible to reduce pressure.

The internal electrodes 9a, 9c are arranged to be freely inserted into and removed from the inside of the external electrode 3, and are arranged in the inside of the plastic containers 7a, 7c. Namely, the internal electrodes 9a, 9c are inserted from above the cover 4b through the space inside the cover 4b and the opening of the cover 4b and the insulating member 4a into the housing spaces 40a, 40c inside the external electrode 3. The base ends of the internal electrodes 9a, 9c are arranged above the cover 4b. On the other hand, the tips of the internal electrodes 9a, 9c are arranged in the inside of the plastic containers 7a, 7c housed inside the housing spaces 40a, 40c of the external electrode 3. The internal electrodes 9a, 9c have tube shapes which are hollow on the inside. Gas blowout holes 49a, 49c are provided in the tips of the internal electrodes 9a, 9c. Further, the internal electrodes 9a, 9c are preferably grounded.

In the description given above, the relationship of the external electrode, the internal electrodes, the insulating member and the cover inside the film forming chamber was described. Next, with reference to FIG. 3 and FIG. 4, the positional relationship of the housing spaces provided in the external electrode will be described in detail taking as an example the case where four housing spaces are provided in one external electrode.

Figure 3:
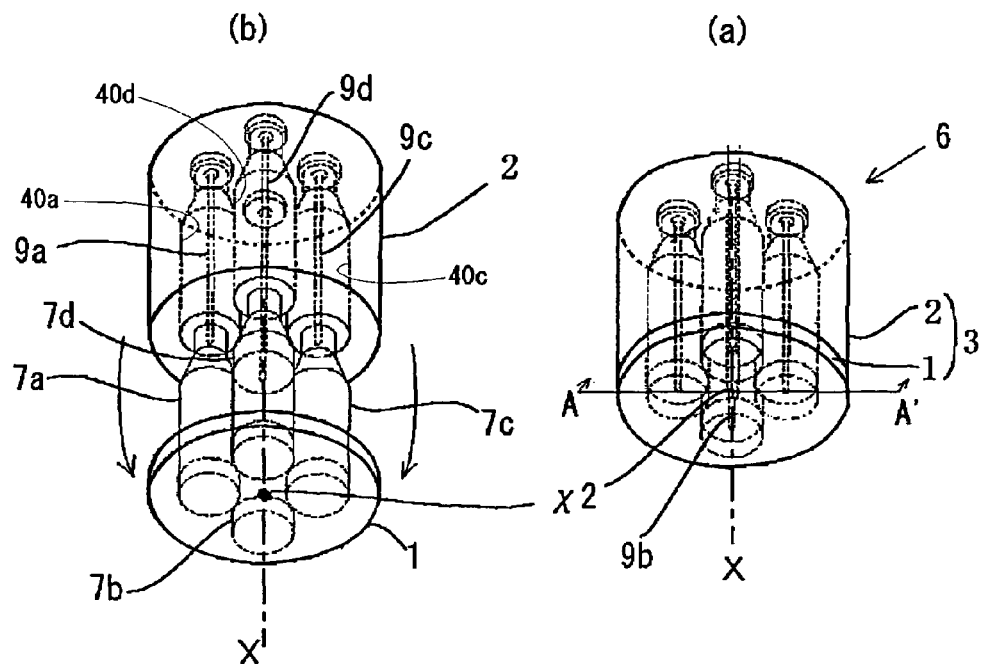
Figure 4:
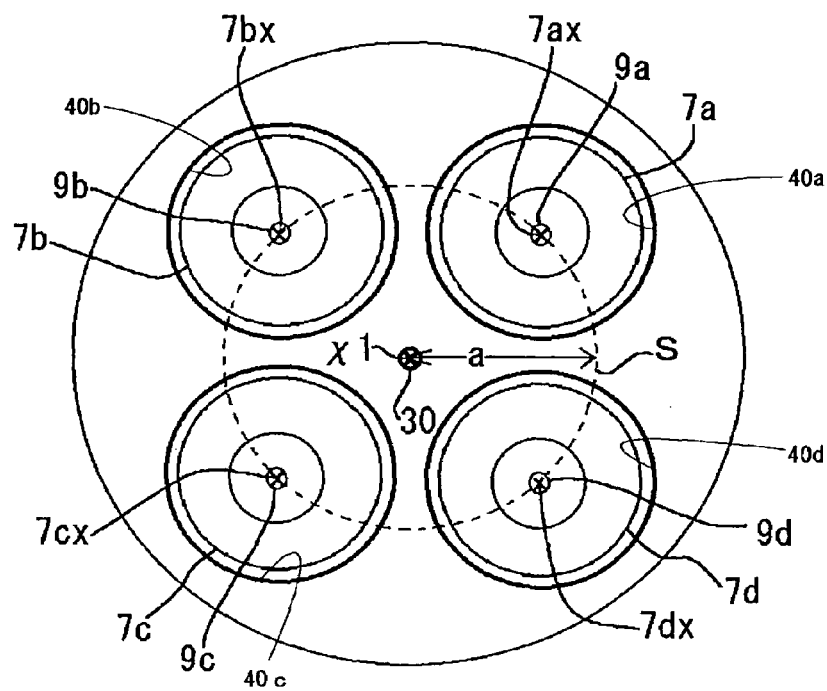
FIG. 4 is a horizontal cross-sectional drawing of the multiple-integrated external electrode taken along B-B'.
Figure 5:
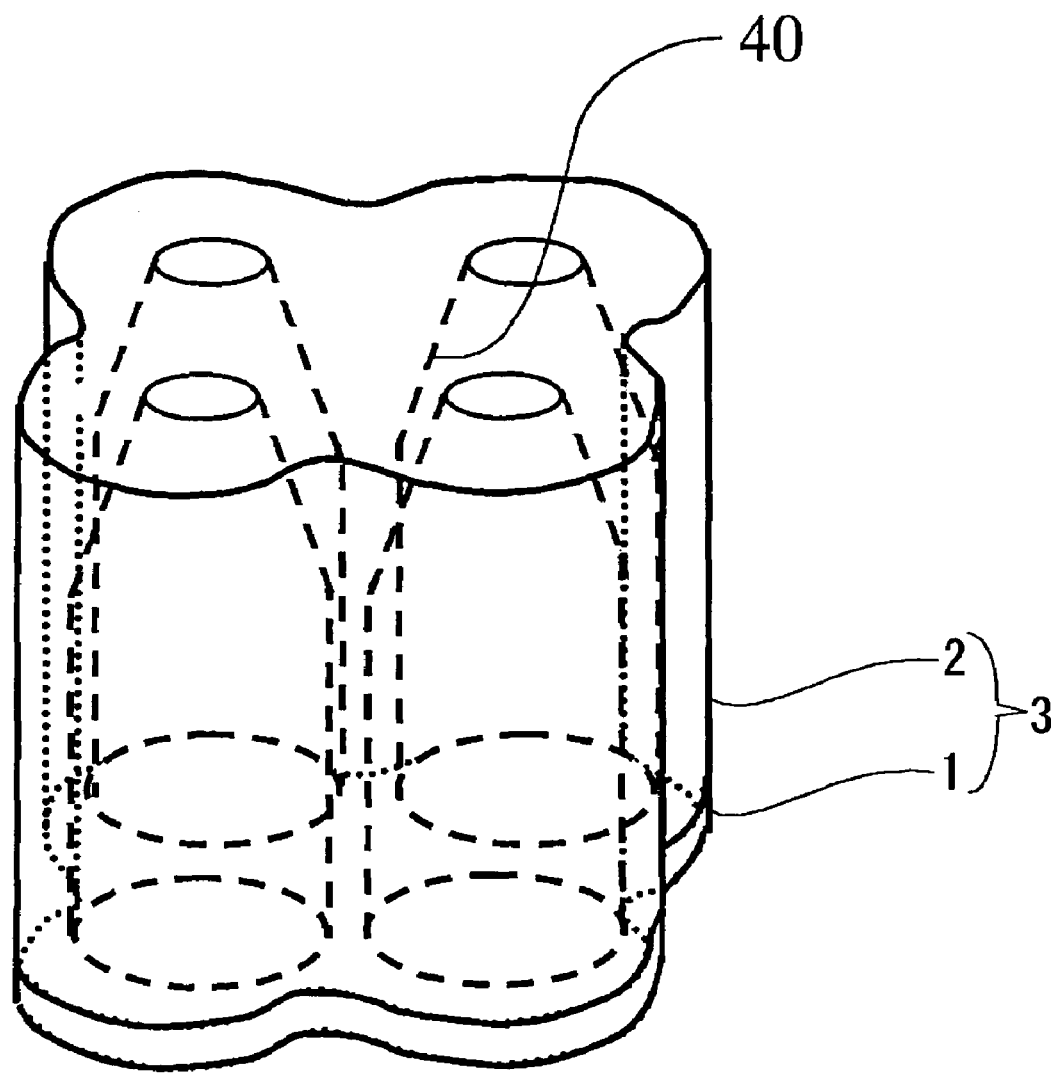
FIG. 5 is a drawing which shows a concrete example of an embodiment of the columnar body.

As shown in FIG. 3, the external electrode 3 is formed to have the shape of one columnar body. The multiple-integrated external electrode shown in FIG. 3(a) is one cylindrically shaped columnar external electrode, but it may also be a columnar body in the form of a square column or elliptic cylinder or the like. Further, as shown in FIG. 5, the external electrode 3 may be a columnar structure made from one columnar body formed by combining shapes which surround each container housing space with an approximately uniform thickness. However, because there is a tendency for the high frequency to be transmitted to the surface of the external electrode, in order to make the transmission distance of the high frequency as equal as possible, the external electrode 3 is preferably a cylindrical body or a square column body having a square horizontal cross section. A plurality (four in FIG. 3) of housing spaces 40a, 40b, 40c, 40d which each house one of the plastic containers 7a, 7b, 7c, 7d are provided in the one columnar body serving as the external electrode 3. In the case of FIG. 3, by housing the plastic containers in each of the housing spaces, four plastic containers are housed in one external electrode. Further, as shown in FIG. 3 and FIG. 4, the central axis of each of the housing spaces 40a, 40b, 40c, 40d is made parallel with the central axis x of the external electrode 3. Further, the housing spaces 40a, 40b, 40c, 40d are provided side by side on the same circle S which uses the central axis x of the external electrode as a center point. As for the shape of the housing spaces inside the external electrode 3, as shown in FIG. 4 which is a horizontal cross-sectional view taken along B-B' of FIG. 2, the housing spaces are arranged so that the centers 7ax~7dx (each of which is a point shown by x) of the housing spaces of the plastic containers 7a~7d are arranged on the circle S having a radius a from the center x1 of the external electrode. At this time, the housing spaces 40a, 40b, 40c, 40d are preferably arranged at equal intervals on the same circle S as shown in FIG. 4.

In this way, it is possible to form an external electrode called a multiple-integrated electrode in which a plurality of housing spaces which each house one plastic container is provided in one columnar body serving as the external electrode, the central axis of each housing space is parallel with the central axis of the external electrode, and the housing spaces are arranged side by side on the same circle which uses the central axis of the external electrode as a center point.

The multiple-integrated external electrode described in the present invention has the same function as a multiple type external electrode in which there is a plural arrangement of a combined structure of a matching box and an external electrode of the type that houses only one plastic container. Further, the multiple-integrated external electrode is integrated to make it possible to house a plurality of plastic containers inside one external electrode, and is an electrode which uses one matching box for this one integrated external electrode, and this makes it possible to reduce the high frequency power sources and matching boxes. Further, by forming the external electrode as one columnar body, the distance from the supply origin of the high frequency to the inner walls of the housing spaces can be made the shortest, and because there is no deviation of the distance between each housing space, it is possible to apply a self bias voltage uniformly to the plastic container wall surface.

In FIG. 3 and FIG. 4, the internal electrodes 9a~9d which correspond respectively to the housing spaces 40a, 40b, 40c, 40d are provided for the one columnar body external electrode 3. Each of the internal electrodes is grounded, and forms a pipeline which can supply a source gas to each container. In the present drawings, the internal electrodes also serve as source material supply pipes.

Further, as shown in FIG. 2, a high-frequency output is introduced to a high-frequency output supply rod 30. As for the container lower portion external electrode 1 of the external electrode 3, the intersection point x2 between the central axis X and the bottom surface of the container lower portion external electrode 1 of the external electrode 3 shown in FIG. 2 forms a high-frequency output supply point. A conductive cable and a conductive metal rod are used in the high-frequency output supply rod 30. Further, a high-frequency output supply rod connection contact 32 functions as a conductive contact point in the case where the container lower portion external electrode and the container upper portion external electrode are assembled at the time containers are put in and taken out. Further, in the present embodiment, the high-frequency output supply point x2 is provided in the container lower portion external electrode, but it is also possible to provided connection points distributed at four places in the container lower portion external electrode 1 near the bottom surface of each plastic container, or it is possible to make a connection or the like on the center axis X in the inside of the external electrode. In any case, the change of the connection point can be appropriately carried out within a range that makes it possible to generate uniform plasma inside each plastic container. Further, in the present embodiment, a description was given for the case where four plastic containers are housed inside one external electrode, but it is also possible to construct an embodiment which uses an external electrode capable of housing a plurality of plastic containers other than four. In the present invention, by using the multiple-integrated external electrode structure, it is possible to achieve either compactness of the apparatus by reducing the number of high frequency power sources and matching boxes, or a multi-fold increase of the productivity by arranging two or more lines on the rotation support body, or it is possible to achieve both.

Figure 6:
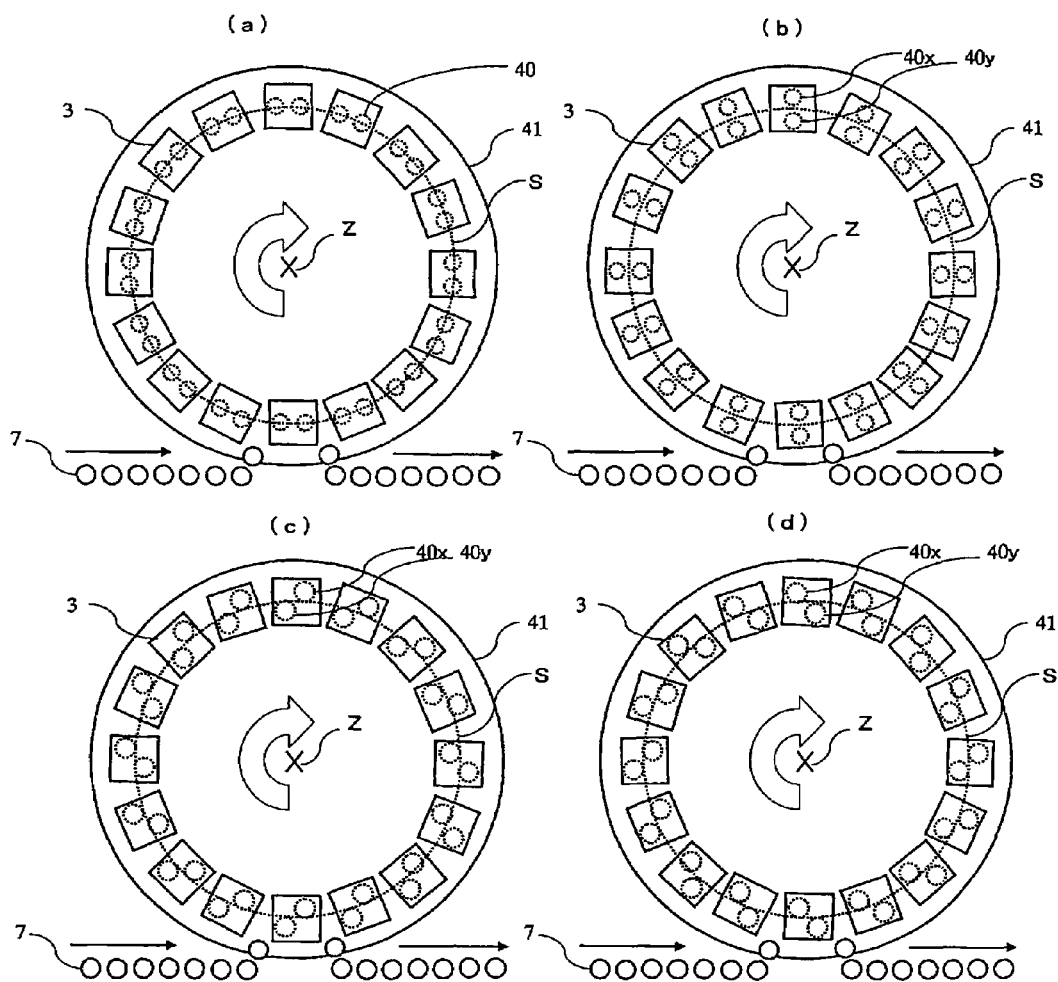
Figure 7:
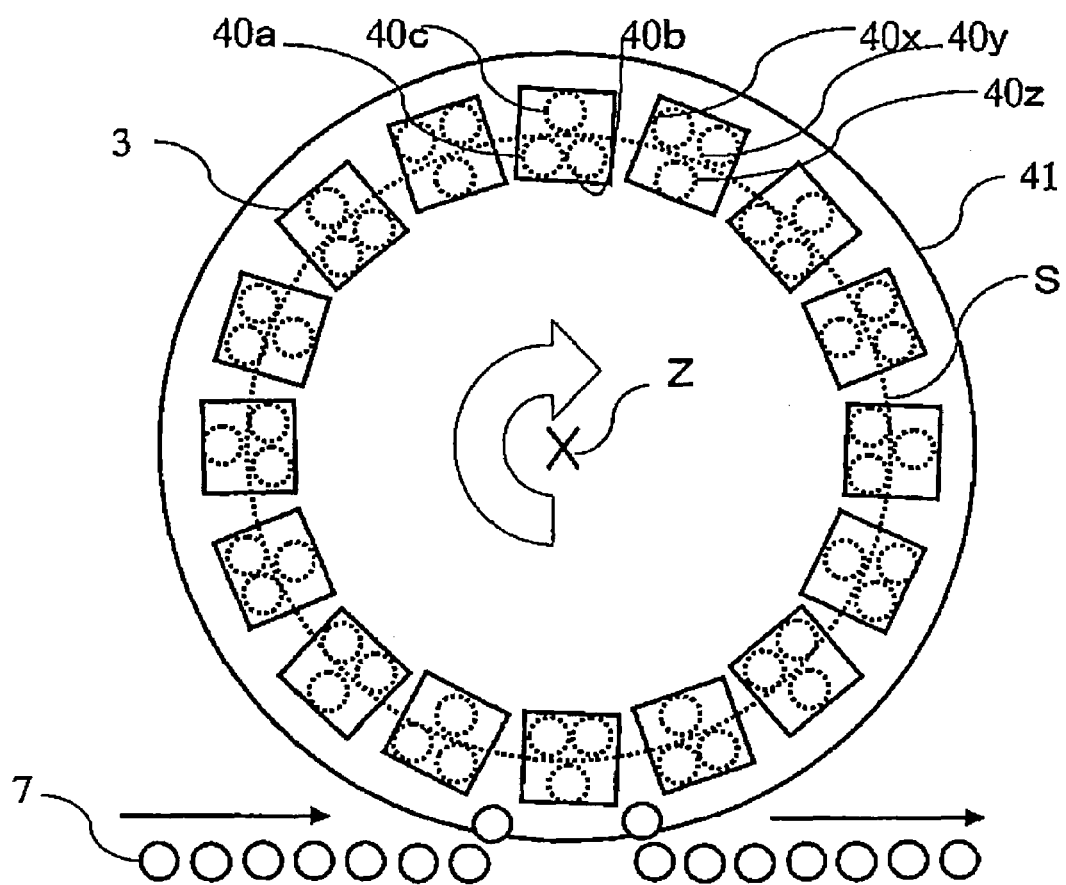
FIG. 7 is a conceptual drawing which shows the arrangement of housing spaces in the case where three housing spaces are provided in one external electrode.
Figure 8:
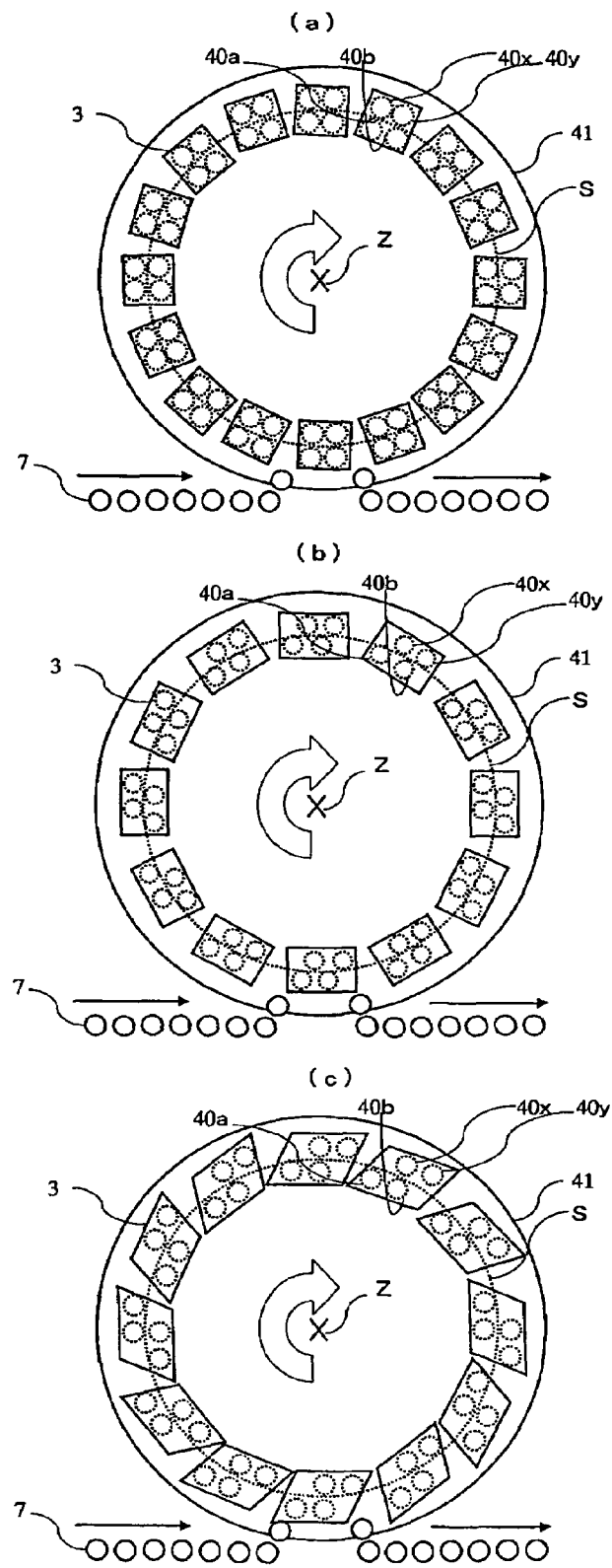

Next, a description will be given for the arrangement of the film forming chambers on the rotation support body. In the present invention, the arrangement of the housing spaces provided in the external electrode of the film forming chamber is essential, and the arrangement shown in FIGS. 6~8 is preferred. FIGS. 6~8 are conceptual drawings which show the arrangement relationship between the rotation support body, the external electrodes arranged on the rotation support body, and the housing spaces provided in the external electrodes, and are drawings which view the rotation support body from the front. Further, in the drawings, the case where the external electrode of the film forming chamber has a square column shape is shown, but this is the same even for a cylindrical shape or elliptic cylinder shape if the arrangement of housing spaces for the rotation support body is the same.

FIG. 6(a) shows the case where two housing spaces 40 are provided in one external electrode 3, wherein the film forming chambers are arranged at equal intervals on the rotation support body so that the housing spaces are arranged on the same circle which uses the rotation axis of the rotation support body 41 as a center point z. In this case, the containers are lined up in one row from a container supply line and a rotary type apparatus up to line for removing containers that have finished film formation.

FIG. 6(b) shows the case where two housing spaces 40 are provided in one external electrode 3, wherein one housing space 40x is arranged outside a circle s formed by each of the film forming chambers and the other housing space 40y is arranged inside the circle s when the film forming chambers are arranged on the rotation support body 41 so that the housing spaces of the external electrodes 3 are arranged in two rows in the circumferential direction of the circle s. In this regard, two rows form the number of rows in the circumferential direction as shown in FIG. 6(b). In this case, one row may be formed in the container supply line, but it is necessary to divide the line into two rows before the rotary type apparatus when the containers are inserted in the housing spaces. The containers that have been loaded in two rows in the rotary type apparatus are maintained as is in two rows inside the apparatus, and the containers that have finished film formation which have been removed from the rotary type apparatus preferably merge from two rows into one row.

In FIG. 6(b), when the film forming chambers are arranged on the rotation support body 41, the housing spaces 40 are arranged in two rows in the circumferential direction of the circle s with the circle s interposed between mutually adjacent housing spaces 40, but as shown in FIG. 6(c), the housing spaces 40 may be arranged in two rows in the circumferential direction with the circle s interposed between mutually shifted housing spaces 40.

Further, as shown in FIG. 6(d), in comparison with FIG. 6(c), the shift direction of the housing spaces 40 may be reversed.

As shown in FIG. 7, when three housing spaces are provided in one external electrode 3 and the film forming chambers are arranged on the rotation support body 41, the housing spaces of the external electrodes 3 may be arranged in two rows in the circumferential direction of the circle s, wherein a relationship is formed so that the two housing spaces 40x, 40y of every other film forming chamber are arranged outside the circle s formed by the film forming chambers with the remaining one housing space 40z arranged inside the circle s, and the two housing spaces 40a, 40b of the adjacent film forming chambers are arranged inside the circle s with the remaining one housing space 40c arranged outside the circle s.

Next, as shown in FIG. 8(a), when four housing spaces are provided in one external electrode 3 and the film forming chambers are arranged on the rotation support body 41, the housing spaces 40 of the external electrode 3 may be arranged in two rows in the circumferential direction of the circle s, wherein the two housing spaces 40x, 40y are arranged outside the circle s formed by the film forming chambers, and the remaining two housing spaces 40a, 40b are arranged inside the circle s.

FIG. 8(a) shows the case where the housing spaces are arranged in two rows in the circumferential direction of the circle s with the circle s interposed between mutually adjacent housing spaces when the film forming chambers are arranged on the rotation support body 41, but the housing spaces may be arranged as shown in FIG. 8(c). Further, as shown in FIG. 8(b), the housing spaces may be arranged in two rows in the circumferential direction with the circle s interposed between mutually shifted housing spaces.

In the apparatuses of FIGS. 6(c)(d), FIG. 7 and FIGS. 8(a)(b)(c), in the same way as in the case of the apparatus of FIG. 6(b), one row may be formed in the container supply line, but it is necessary to divide the line into two rows before the rotary type apparatus when the containers are loaded in the housing spaces. The containers that have been loaded in two rows in the rotary type apparatus are maintained as is in two rows inside the apparatus, and the containers that have finished film formation which have been removed from the rotary type apparatus preferably merge from two rows into one row.

By forming the apparatus of FIG. 6(a), because it is possible to form a film in two plastic containers simultaneously by one high frequency power source, the number of power sources and the number of matching boxes can be reduced. Further, by forming the apparatus of FIGS. 6(b)(c)(d), FIG. 7 or FIGS. 8(a)(b)(c), it is possible to secure two or more film forming chambers proceeding through film formation at exactly the same timing in accordance with the rotation of the rotation support body, and in addition to reducing the number of power sources and the number of matching boxes, this makes it possible to double the productivity per unit time. In forming two rows, because the container loading mechanism and the container removing mechanism are not made more complex than is necessary, the number of rows achieves both an improvement in productivity and prevents the container loading mechanism and the container removing mechanism from being made more complex.

The container according to the present invention includes a container that uses a cover or a stopper or is sealed, or a container used in an open state that does not use these. The size of the opening is determined in accordance with the contents. The plastic container includes a plastic container having a moderate stiffness and a prescribed thickness, and a plastic container formed from a sheet material that does not have stiffness. Further, this includes the cover of the container. The substance that is filled into the plastic container according to the present invention can be a beverage such as a carbonated beverage or a fruit juice beverage or a soft drink or the like, as well as a medicine, an agricultural chemical, or a dried food which hates moisture absorption. Further, this includes a returnable container and a one-way container.

The resin used when forming the plastic container of the present invention can be polyethylene terephthalate (PET) resin, polyethylene terephthalate type co-polyester resin (a copolymer named PETG which uses cyclohexane de-methanol in place of ethylene glycol for the alcohol component of polyester, made by Eastman), polybutylene terephthalate resin, polyethylene naphthalate resin, polyethylene resin, polypropylene (PP) resin, cycloolefin copolymer (COC, annular olefin copolymer) resin, ionomer resin, poly-4-methylpentene-1 resin, polymethyl methacrylate resin, polystyrene resin, ethylene-vinyl alcohol copolymer resin, acrylonitrile resin, polyvinyl chloride resin, polyvinylidene chloride resin, polyamide resin, polyamide-imide resin, polyacetal resin, polycarbonate resin, polysulfone resin, or ethylene tetrafluoride, acrylonitrile-styrene resin, or acrylonitrile-butadiene-styrene resin. Of these, PET is particularly preferred.

In FIG. 2, the source gas introduction means 41 introduces a source gas supplied from a source gas generating source 20 to the inside of the plastic containers 7. Namely, one side of pipelines 10, 11 is connected to the base ends of the internal electrodes 9, and the other side of the pipeline 11 is connected to a mass flow controller 19 via a vacuum valve 16. The other side of the mass flow controller 19 is connected to the source gas generating source 20 via a pipeline. The source gas generating source 20 generates a hydrocarbon gas or the like such as acetylene or the like.

As shown in FIG. 1, the source gas introduction means supplies a source gas to each film forming chamber. Source gas introduction means may be provided for each film forming chamber, but a source gas may be introduced to all of the film forming chambers by one source gas generating source. In this case, branching pipelines corresponding to the number of film forming chambers may be provided between the source gas generating source and the mass flow controller. In this regard, the same number of mass flow controllers as the number of film forming chambers is provided. In any case, there should be an arrangement which makes it possible to supply a prescribed amount of source gas to each film forming chamber.

In the case where a DLC film is formed, for example, aliphatic hydrocarbons, aromatic hydrocarbons, oxygen-containing hydrocarbons, nitrogen-containing hydrocarbons and the like which form a gas or liquid at room temperature are used as a source gas. In particular, benzene, toluene, o-xylene, m-xylene, p-xylene, cyclohexane and the like having a carbon number of 6 or higher are preferred. In the case of being used in containers for food or the like, from the viewpoint of hygiene, aliphatic hydrocarbons, especially ethylene type hydrocarbons such as ethylene, propylene or butylene or the like, or acetylene type hydrocarbons such as acetylene, allylene or 1-butyne are preferred. These materials may be used separately or as a gas mixture or two or more types. Further, these gases may be used in a way in which they are diluted by a noble gas such as argon or helium. Further, in the case where a silicon-containing DLC film is formed, a Si-containing hydrocarbon gas is used.

The DLC film in the present invention is a film called an i-carbon film or an amorphous carbon hydride film (a-C:H), and also includes a hard carbon film. Further, a DLC film is an amorphous-state carbon film, and includes $SP^3$ bonding. A hydrocarbon gas such as acetylene, for example, is used as a source gas for forming the DLC film, and a Si-containing hydrocarbon gas is used as a source gas for forming a Si-containing DLC film. By forming this kind of DLC film on the internal surface of a plastic container, a container is obtained which can be used as a one-way container or a returnable container for carbonated beverages and sparkling beverages and the like.

The space inside the conductive member 4b is connected to one side of a pipeline 13, and the other side of the pipeline 13 is connected to a vacuum pump 21 via a vacuum valve 18. The vacuum pump 21 is connected to an exhaust duct 29. Because there is a plurality of film forming chambers, exhaust may be carried out by concentrating the exhaust system at one vacuum pump, or exhaust may be carried out by allotting a plurality of vacuum pumps.

The plastic container loading means (not shown in the drawings) are means wherein, for example, the lower portion external electrode 1 is opened downward with respect to the upper portion external electrode 2 in order to house containers, plastic containers are placed on the lower portion external electrode 1, and the lower portion external electrode 1 is raised to formed a sealed state by an O-ring interposed between the lower portion external electrode 1 and the upper portion external electrode 2. As shown in FIG. 1, for example, the uncoated plastic containers are supplied by a container loading handling apparatus (not shown in the drawings) which removes containers separately from a conveyor and places them on the lower portion external electrode 1.

Pre-film-formation gas adjustment means replaces the source gas inside the plastic containers and carries out adjustment to a prescribed film forming pressure, and cooperate with the source gas introduction means and the exhaust of the vacuum pump.

CVD film forming means are means which form a CVD film on the internal surface of the plastic containers, and cooperate with the high frequency supply means, the source gas introduction means and the exhaust means in the film forming chambers. In this regard, the exhaust means are constructed from the vacuum valve 18, the vacuum pump 21 and the exhaust duct 29.

Post-film-formation gas adjustment means are means which remove source gas remaining inside the film forming chambers and the plastic containers, open the inside of the plastic containers to the atmosphere after film formation, and cooperate with the exhaust means and an atmosphere open valve 17.

Container removing means are means for removing containers from the housing spaces inside the film forming chambers, and are means wherein, for example, the lower portion external electrode 1 is opened downward with respect to the upper portion external electrode 2 in order to remove containers, and the coated plastic containers held on the lower portion external electrode 1 are transferred onto a conveyor. As shown in FIG. 1, the coated containers are placed on a conveyor by a container removing handling apparatus (not shown in the drawings) which removes containers from the housing spaces inside the film forming chambers, and are conveyed away.

As shown in FIG. 2, the high frequency supply means are constructed by a fixed matching device (indicated as Tip M.B. in the drawings) provided in each external electrode, one or more high frequency power sources 15, and an automatic matching device (automatic matching box) 14 provided in each high frequency power source 15. At this time, one high frequency power source may be provided in one film forming chamber, or high frequency distribution means may be provided to distribute a high frequency supplied from a high frequency power source to multiple locations before the fixed matching device, whereby a high frequency is supplied to a plurality of external electrodes from one high frequency power source. Alternatively, switching by a high frequency relay may be carried out so that a sequential high frequency is supplied to the chamber rotated to a prescribed position corresponding to a rotation position of the rotary type rotation support body (turntable). In any case, there should be an arrangement which makes it possible to supply a high frequency to the external electrode of each film forming chamber. Further, in the case where one high frequency power source is provided in one film forming chamber, each film forming chamber of the rotary type apparatus of FIG. 1 is constructed as shown in FIG. 2.

A fixed matching device is provided in each external electrode, and impedance matching of the supplied high frequency and the plasma generated inside the external electrode is carried out by a coaxial cable. The fixed matching device is connected to the external electrode by a copper-plated wire. Further, because the automatic matching device is large with respect to the chamber, a fixed matching device may be provided separately for each external electrode without the need for the case where the automatic matching device is miniaturized or the case where it is possible to provide the automatic matching device in some other place of the chamber. Further, in the case where the automatic matching device is provided separate from the chamber, power may be supplied to the chamber using a coaxial pipe. In this case, it is possible to omit the fixed matching devices.

The high frequency power source generates high frequency energy for converting source gas to plasma inside the plastic containers. In order to carry out matching quickly and shorten the time required for plasma generation, the high frequency power source is preferably a transistor type high frequency power source, and is preferably a high frequency power source which carries out matching by a mobile frequency system or an electronic system. The frequency of the high frequency power source is 100 kHz~1,000 MHz, and the industrial frequency of 13.56 MHz is used, for example.

The wires from the automatic matching device to the fixed matching device are connected by a coaxial cable. The coaxial cable is given a characteristic impedance of 50Ω, for example. In this regard, the automatic matching device adjusts the change in impedance of the coaxial cable.

Figure 9:
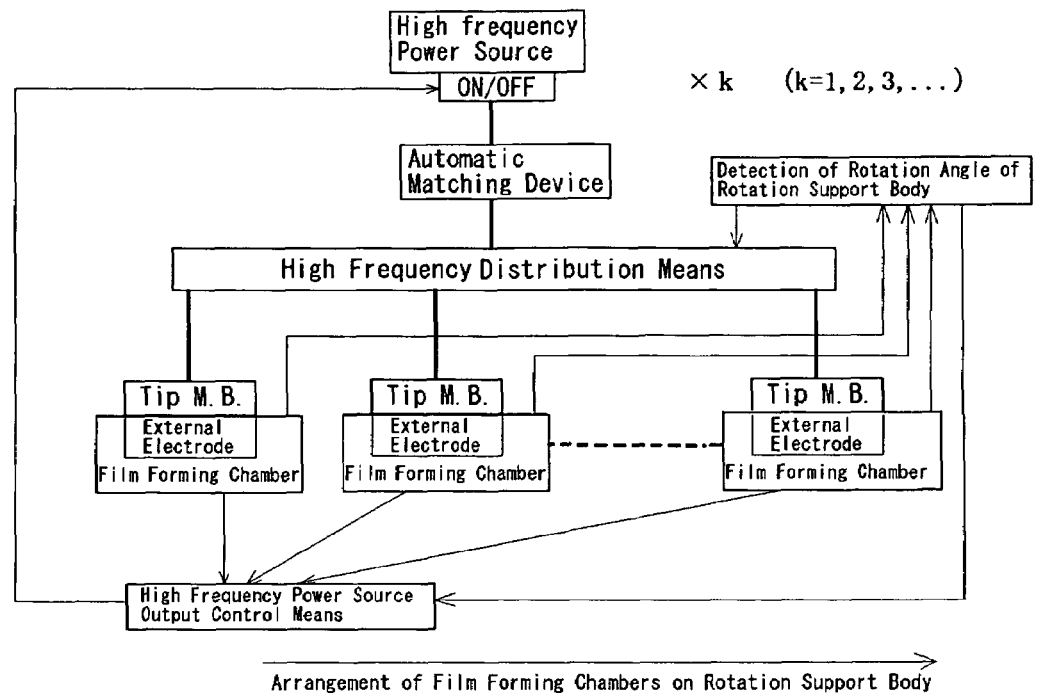
FIG. 9 is a conceptual drawing which shows one embodiment of a basic structure which includes high frequency supply means in the rotary type CVD film forming apparatus for mass production of the present invention.
Figure 10:
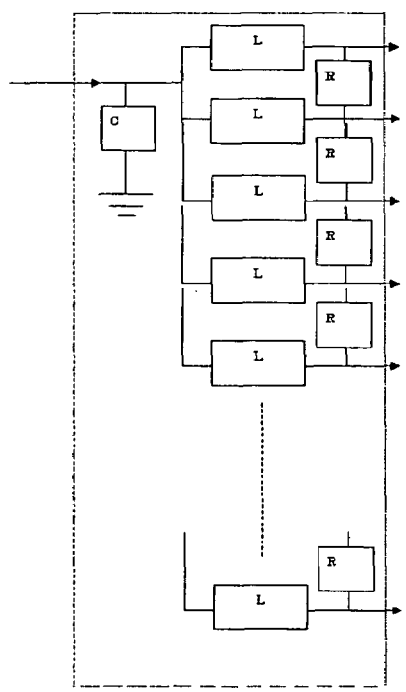
FIG. 10 is a drawing which shows one embodiment of a distribution circuit, and shows a parallel type and a cascade type.
Figure 10:
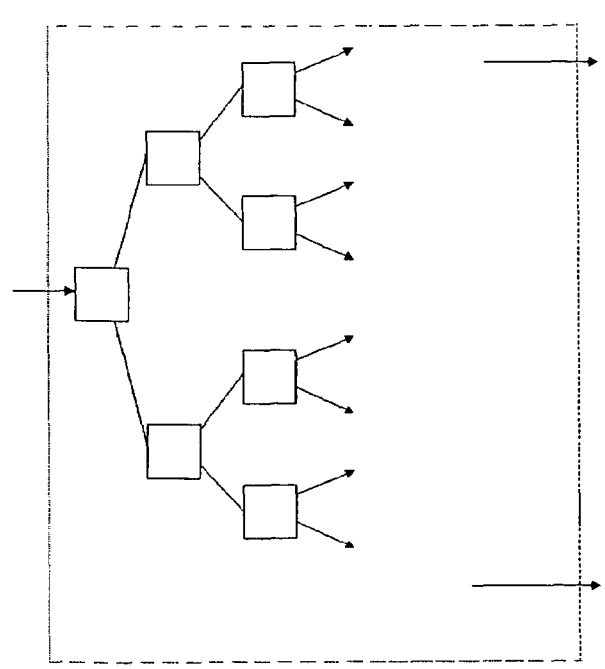

As shown in FIG. 9, high frequency distribution means is provided in the case where the high frequency supplied from the high frequency supply means is distributed to multiple locations before the fixed matching device so that a high frequency is supplied to a plurality of external electrodes from one high frequency power source. As an example of one embodiment, the high frequency distribution means is constructed from a distribution circuit which distributes the high frequency simultaneously and evenly and a change-over switch which switches each distribution output of the distribution circuit on and off. As shown in FIG. 10, for example, the distribution circuit is a parallel type, namely, a circuit formed by a coil, a resistor and a capacitor, and is a circuit which distributes one input to a plurality of outputs. Alternatively, a cascade type circuit may be used. The change-over switch is a high frequency relay for switching the output of the distribution circuit on and off. Alternatively, the high frequency distribution means is provided in the case where switching is carried out by a high frequency relay so that a sequential high frequency is supplied to the chamber rotated to a prescribed position corresponding to a rotation position of the rotary type rotation support body (turntable). In this embodiment, a distribution circuit is not used, and sequential switching by a high frequency relay is carried out. Further, the distribution and switching may be combined.

By using the high frequency distribution means of the present embodiment, it is possible to switch the high frequency supply on and off independently for each external electrode.

Next, a description will be given for a method of forming a DLC film inside containers using the rotary type continuous CVD film forming apparatus of the present invention. First, a description will be given for the manufacturing cycle, and the method of forming a DLC film will be explained.

First, using FIG. 2, a description will be given for the container loading process which loads plastic containers inside the film forming chambers. The vacuum valve 17 is opened to open the inside of the film forming chamber 6 to the atmosphere, and the lower portion external electrode 1 of the external electrode 3 forms a removed state from the upper portion external electrode 2. Uncoated plastic containers (the containers that have not yet undergone film formation of FIG. 1) on a conveyor (not shown in the drawings) are removed from the conveyor by the container loading handling apparatus (not shown in the drawings) and placed in the lower portion external electrode 1, and then the plastic containers 7 are inserted and provided in the housing spaces 40 by raising the lower portion external electrode 1 toward the upper portion external electrode 2. At this time, the internal electrodes 9 form an inserted state inside the plastic containers 7, and the external electrode 3 is sealed by the O-ring 8.

Further, the film forming chamber 6 of FIG. 2 which is a vertical cross-sectional conceptual view taken along A-A' of FIG. 3(*a*) has four housing spaces 40*a*, 40*b*, 40*c*, 40*d*, four plastic containers 7*a*, 7*b*, 7*c*, 7*d* and four internal electrodes 9*a*, 9*b*, 9*c*, 9*d*, but these are mentioned as the housing spaces 40, the plastic containers 7 and the internal electrodes 9 for the sake of convenience (this same notation is used below).

Next, a description will be given for the pre-film-formation gas adjustment process which replaces the inside of the plastic containers 7 with a source gas and adjusts the pressure inside the plastic containers 7 to a prescribed film forming pressure. With reference to FIG. 2, after the vacuum valve 17 is closed, the vacuum valve 18 is opened, and the vacuum pump 21 is operated. In this way, the inside of the vacuum chamber 6 including the inside of the plastic containers 7 are exhausted through the pipeline 13, whereby a vacuum is created in the pressure-reducing chamber inside the film forming chamber 6. At this time, the pressure inside the pressure-reducing chamber is 2.6~66 Pa ($2\times10^{-2}$~$5\times10^{-1}$ Torr).

Next, the vacuum valve 16 is opened, a hydrocarbon gas is generated in the source gas generating source 20, the hydrocarbon gas is introduced inside the pipeline 22, and then the hydrocarbon gas which undergoes flow rate control by the mass flow controller 19 passes through the pipelines 10, 11 and the internal electrodes 9 which are at ground potential and is blown out from the gas blowout hole 49. In this way, the hydrocarbon gas is introduced to the inside of the plastic containers 7. Then, by balancing the controlled gas flow rate and the air exhaust performance, the pressure inside the pressure-reducing chamber of the film forming chamber 6 and the plastic containers 7 is stabilized and maintained at a pressure (e.g., about 6.6~665 Pa, 0.05~5.00 Torr) suitable for forming a DLC film.

Next, a description will be given for a CVD film forming process which forms a DLC film on the internal surfaces of the plastic containers 7 by supplying a high frequency output of 50~2,000 W, for example, to the external electrode 3. In the film forming chamber 6 of the state in the CVD film forming process, RF output (e.g., 13.56 MHz) is supplied by the high frequency supply means. In this way, a voltage is generated between the external electrode 3 and the internal electrodes 9. At this time, the automatic matching device carries out impedance matching by the inductance L and the capacitance C so as to minimize the reflected waves from the entire electrode supplying output. The fixed matching device converts the impedance of the coaxial cable to the impedance of plasma. In this way, hydrocarbon plasma generated inside the plastic containers 7, and a DLC film is formed on the internal surfaces of the plastic containers 7. At this time, by forming the external electrode as one columnar body, the distance from the supply origin of the high frequency to the inner walls of the housing spaces can be made the shortest, and because there is no deviation of the distance between each housing space, it is possible to apply a uniform self bias voltage to the plastic container wall surface. The film formation time becomes about several seconds which is short. Next, the RF output from the high frequency supply means is stopped, the plasma dissipates, and the formation of a DLC film is terminated. At the same time, the vacuum valve 16 is closed and supply of the source gas is stopped. DLC films were formed simultaneously in the internal surfaces of a plurality of plastic containers inside the same film forming chamber.

Next, a description will be given for the post-film-formation gas adjustment process which returns the pressure inside the coated containers to atmospheric pressure. In order to remove the hydrocarbon gas remaining inside the pressure-reducing chamber of the film forming chamber 6 and the plastic containers 7, the vacuum valve 18 is opened, and the hydrocarbon gas inside the pressure-reducing chamber of the film forming chamber 6 and the plastic containers 7 is exhausted by the vacuum pump 21. Then, the vacuum valve 18 is shut, and the exhaust is terminated. The pressure inside the film forming chamber 6 at this time is 6.6~665 Pa (0.05~5.00 Torr). Then, the vacuum valve 17 is opened. In this way, air enters the space inside the cover 5 and the space inside the external electrode 3, whereby the inside of the film forming chamber 6 is opened to the atmosphere.

Next, a description will be given for the container removing process which removes coated containers. The lower portion external electrode 1 of the external electrode 3 is placed in a removed state from the upper portion external electrode 2. The plastic containers 7 housed in the housing spaces inside the upper portion external electrode 2 are removed from the lower side of the upper portion external electrode 2 by the container removing handling apparatus (not shown in the drawings). Next, the coated containers (the containers that have finished film formation of FIG. 1) are placed on a conveyor (not shown in the drawings) and conveyed away.

Figure 11:
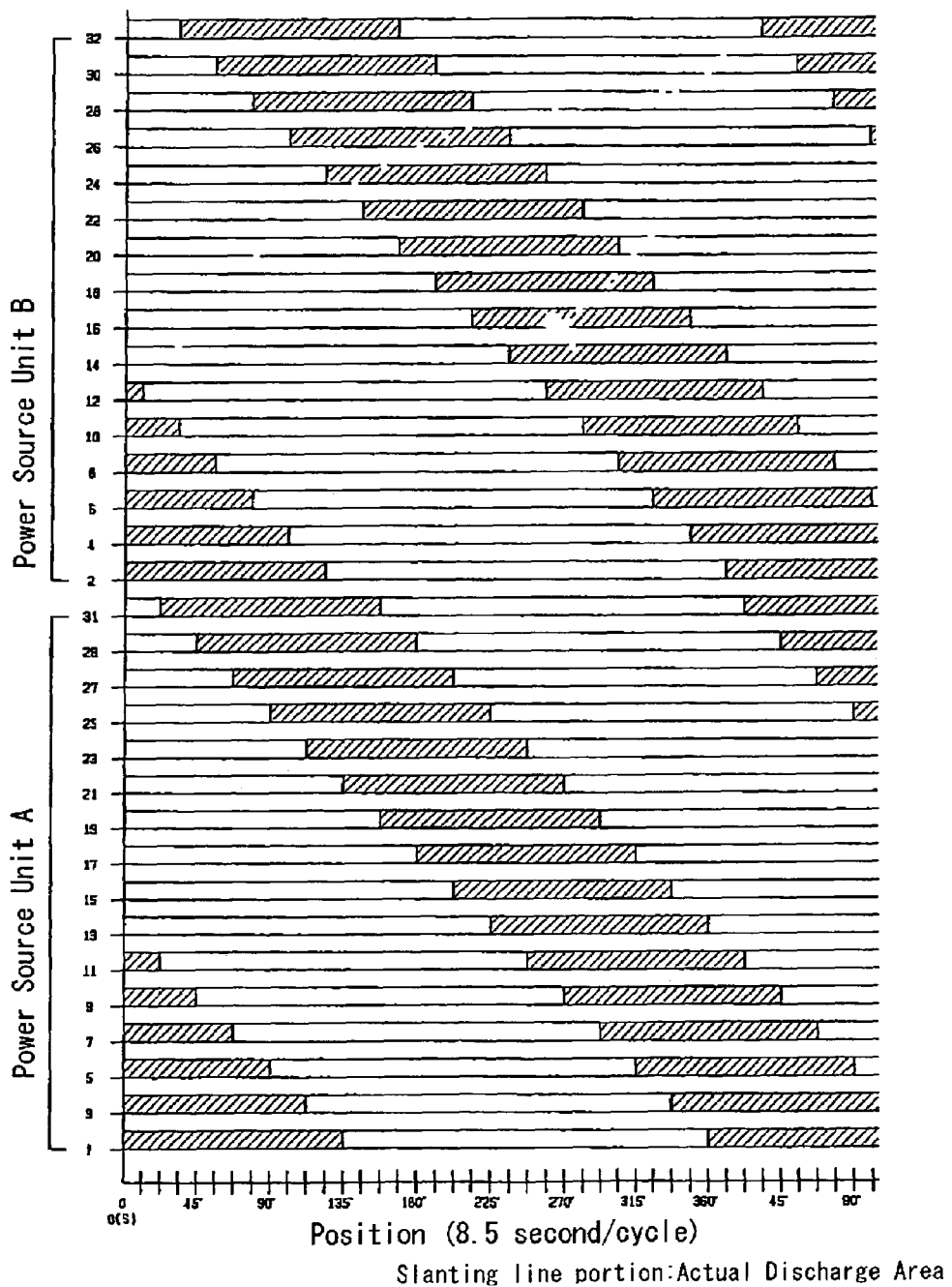
FIG. 11 is a drawing which shows one embodiment of how the manufacturing cycle proceeds.
Figure 12:
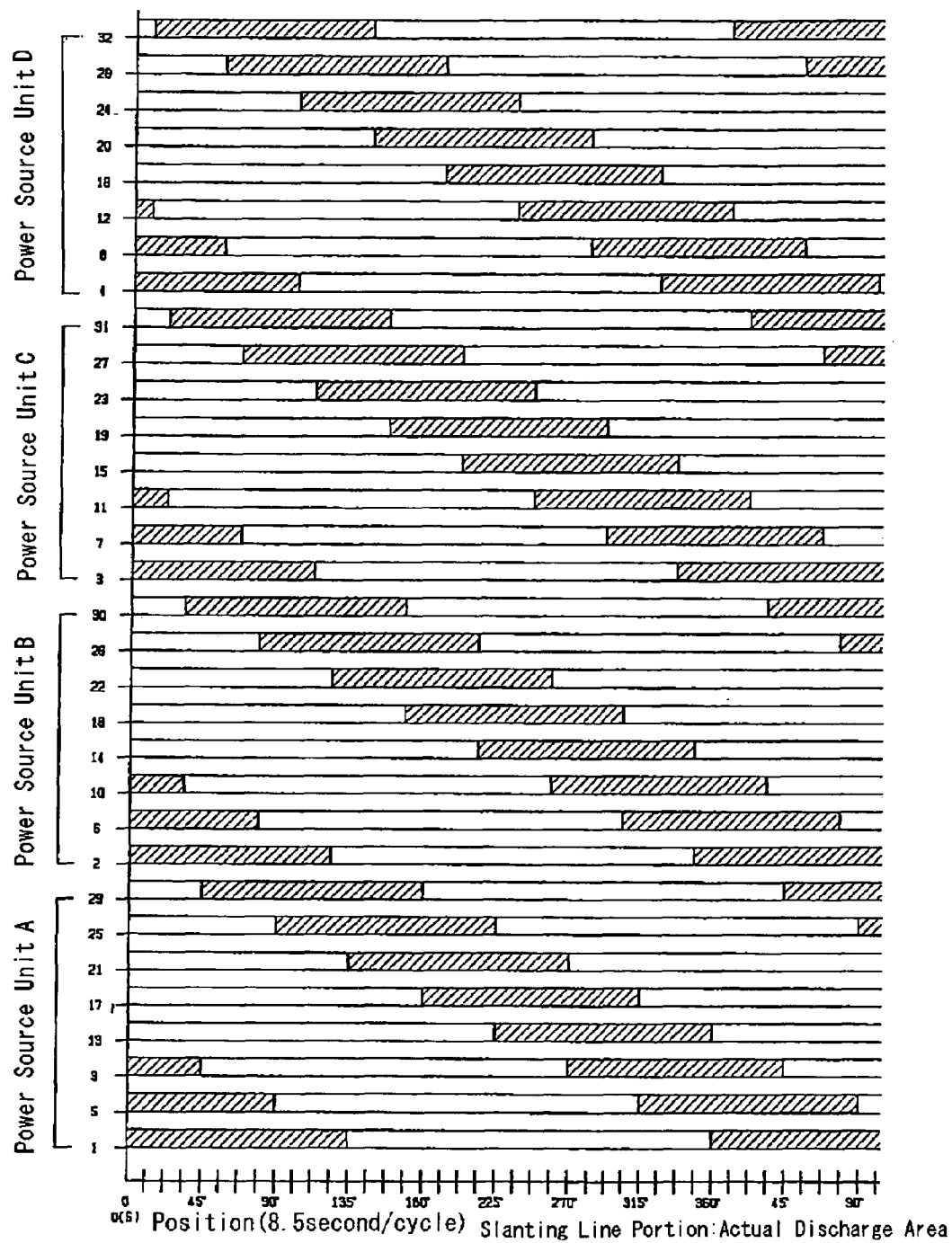
FIG. 12 is a drawing which shows a second embodiment of how the manufacturing cycle proceeds.
Figure 13:
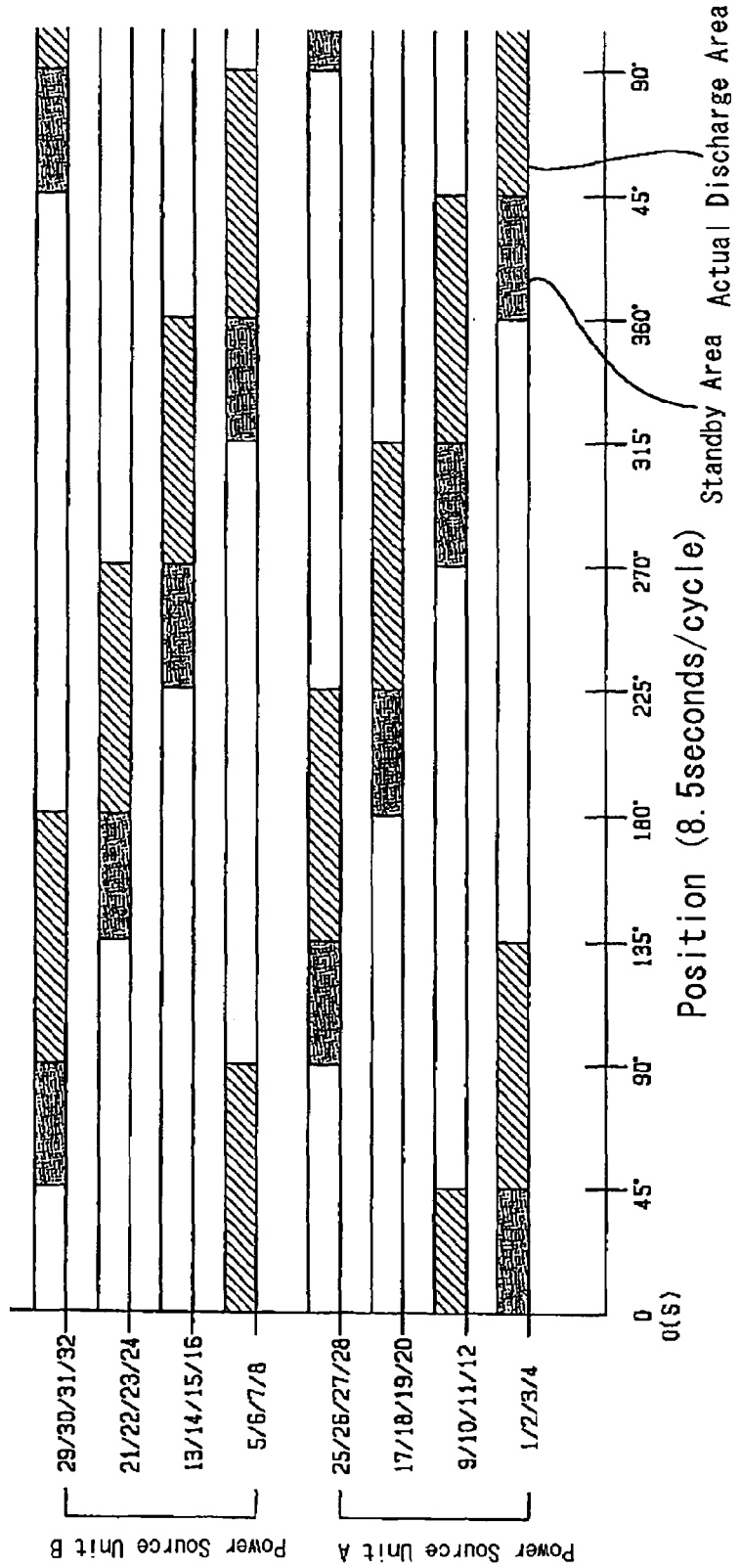
FIG. 13 is a drawing which shows a third embodiment of how the manufacturing cycle proceeds.
Figure 14:
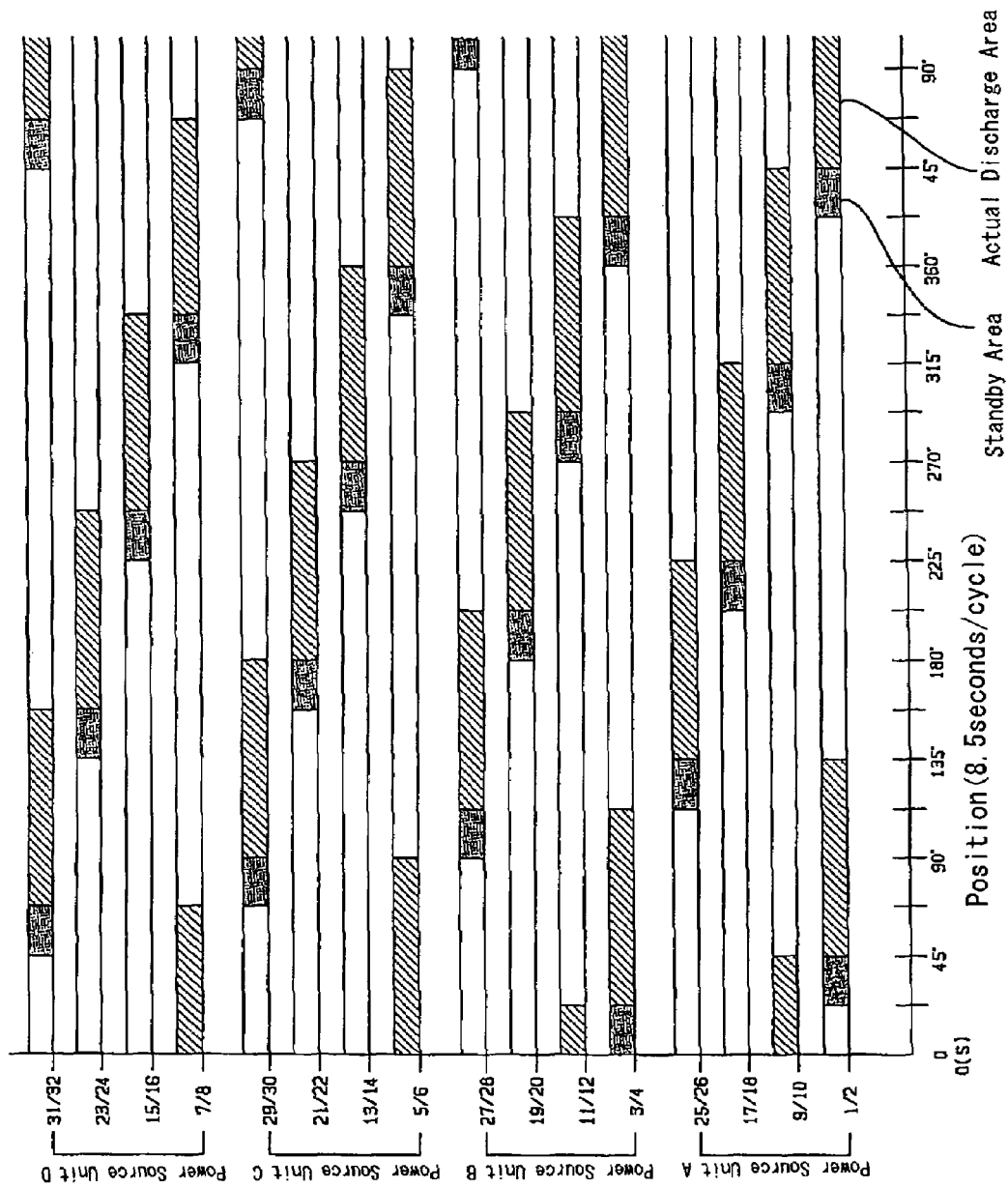
FIG. 14 is a drawing which shows a fourth embodiment of how the manufacturing cycle proceeds.

Next, a description will be given for control method of the film formation timing in the case where a rotary type apparatus is used. When the CVD film forming process is carried out for one portion of film forming chambers out of all the film forming chambers of the rotation support body by the high frequency distribution means, the method preferably carries out the manufacturing cycle for each film forming chamber a plurality of times at fixed intervals. For example, the method is carried out at the timing shown in FIG. 11 or FIG. 12. FIG. 11 shows the case where there are 32 film forming chambers, and these are supplied with a high frequency by two high frequency power sources (A and B). Further, FIG. 12 shows the case where there are 32 film forming chambers, and these are supplied with a high frequency by four high frequency power sources (A, B, C and D). Further, as shown in FIG. 13 or FIG. 14, it is possible to form units by collecting several film forming chambers, and the manufacturing cycle may be carried out at fixed intervals. FIG. 13 shows the case where there are 32 film forming chambers, and these are supplied with a high frequency by two high frequency power sources (A and B). Further, FIG. 14 shows the case where there are 32 film forming chambers, and these are supplied with a high frequency by four high frequency power sources (A, B, C and D). Further, the numbers 1~32 are numbers which are sequentially applied to the film forming chambers on the rotation support body. Further, in FIGS. 11~14, a prescribed position of the rotation support body is made 0° degrees, and the rotation degree which uses this 0° as a reference forms the horizontal axis of the drawings. Further, when a high frequency is supplied simultaneously, a uniform high frequency is preferably supplied to each housing space and each film forming chamber. By carrying out control in this way, during the time the rotation support body undergoes one rotation at a fixed speed, the manufacturing cycle is repeatedly carried out for the plurality of film forming chambers arranged on the rotation support body as in FIG. 1 sequentially in accordance with the rotation angle of the rotation support body, whereby DLC film coated plastic containers are mass produced.

In the present invention, the number of chambers, the number of high frequency power sources and the number of structural components and the like may be appropriately changed in accordance with the required performance of the apparatus.

In the present embodiment, a PET bottle for beverages was used as the container having a thin film formed on the inside, but it is also possible to use containers used for other uses.

Further, in the present embodiment, a DLC film or a Si-containing DLC film is the thin film formed by the CVD film forming apparatus, but it is also possible to use the film forming apparatus described above when forming other thin films inside containers.

The film thickness of the DLC film is formed to be 0.003~5 µm.

The invention claimed is:

1. A rotary type CVD film forming apparatus for mass production, comprising:
   a film forming chamber including:
      one columnar body serving as an external electrode and including a plurality of housing spaces for housing one plastic container each in one said housing space so that the central axis of each of said housing spaces is parallel with the central axis of said external electrode and said housing spaces are arranged side by side on the same circle which uses the central axis of the external electrode as a center point,
      internal electrodes arranged to be freely inserted from the mouth portion into the inside of the plastic containers loaded in each of said housing spaces,
      an insulating member to form an insulating state between the internal electrodes and the external electrode when said internal electrodes are inserted inside said plastic containers, and
      a cover which is closed for reducing the pressure inside said housing spaces,
      wherein a plurality of said film forming chambers is arranged on a rotation support body at equal intervals in a circular state;
   source gas introduction means which introduce a source gas that is converted to plasma inside the plastic containers housed in each of said film forming chambers;
   high frequency supply means which supply a high frequency to the external electrode of each of said film forming chambers; and
   high frequency distribution means which switch the high frequency supply on and off independently for each external electrode to form a CVD (chemical vapor deposition) film on the internal surfaces of said plastic containers.

2. The rotary type CVD film forming apparatus for mass production described in claim 1, wherein said housing spaces are arranged side by side at equal intervals on the same circle which uses the central axis of said external electrode as a center point.

3. The rotary type CVD film forming apparatus for mass production described in claim 1, wherein two housing spaces are provided in one external electrode, and said film forming chambers are arranged at equal intervals on said rotation support body so that said housing spaces are arranged on the same circle which uses the rotation axis of said rotation support body as a center point.

4. The rotary type CVD film forming apparatus for mass production described in claim 1, wherein two housing spaces are provided in one external electrode, and when said film forming chambers are arranged on said rotation support body, one housing space is arranged outside a circle formed by each of said film forming chambers and the other housing space is arranged inside said circle, whereby the housing spaces of said external electrodes are arranged in two rows in the circumferential direction of said circle.

5. The rotary type CVD film forming apparatus for mass production described in claim 1, wherein three housing spaces are provided in one external electrode, and when said film forming chambers are arranged on said rotation support body, a relationship is formed so that two housing spaces of every other film forming chamber are arranged outside the circle formed by the film forming chambers with the remaining one housing space arranged inside said circle, and two housing spaces of the adjacent film forming chambers are arranged inside said circle with the remaining one housing space arranged outside said circle, whereby the housing spaces of said external electrodes are arranged in two rows in the circumferential direction of said circle.

6. The rotary type CVD film forming apparatus for mass production described in claim 1, wherein four housing spaces are provided in one external electrode, and when said film forming chambers are arranged on said rotation support body, two housing spaces are arranged outside a circle formed by the film forming chambers, and the other two housing spaces are arranged inside said circle, whereby the housing spaces of said external electrodes are arranged in two rows in the circumferential direction of said circle.

7. The rotary type CVD film forming apparatus for mass production described in claim 4, wherein when said film forming chambers are arranged on said rotation support body, said housing spaces are arranged in two rows in the circumferential direction of said circle with said circle interposed between mutually adjacent housing spaces, or said housing spaces are arranged in two rows in said circumferential direction with said circle interposed between mutually shifted housing spaces.

8. The rotary type CVD film forming apparatus for mass production described in claim 1, wherein a hydrocarbon gas or a Si-containing hydrocarbon gas is used as said source gas, and a DLC film is formed as said CVD film.

* * * * *